United States Patent
Williams et al.

(10) Patent No.: US 11,533,105 B1
(45) Date of Patent: Dec. 20, 2022

(54) SYSTEMS AND METHODS FOR DETERMINING REFLECTION AND TRANSMISSION COEFFICIENTS

(71) Applicant: CABLE TELEVISION LABORATORIES, INC., Louisville, CO (US)

(72) Inventors: Thomas Holtzman Williams, Longmont, CO (US); Lin Cheng, Superior, CO (US)

(73) Assignee: Cable Television Laboratories, Inc., Louisville, CO (US)

( * ) Notice: Subject to any disclaimer, the term of this patent is extended or adjusted under 35 U.S.C. 154(b) by 0 days.

(21) Appl. No.: 17/336,004

(22) Filed: Jun. 1, 2021

Related U.S. Application Data

(60) Provisional application No. 63/032,987, filed on Jun. 1, 2020.

(51) Int. Cl.
*H04B 10/07* (2013.01)
*H04B 10/071* (2013.01)
*H04B 3/48* (2015.01)
*H04B 10/077* (2013.01)
*G01R 31/08* (2020.01)

(52) U.S. Cl.
CPC ............ *H04B 10/071* (2013.01); *H04B 3/48* (2013.01); *H04B 10/0775* (2013.01); *G01R 31/08* (2013.01); *H04B 10/07* (2013.01)

(58) Field of Classification Search
CPC .... H04B 10/071; H04B 3/48; H04B 10/0775; H04B 10/07; G01R 31/08

USPC .......................................................... 398/9–38
See application file for complete search history.

(56) References Cited

U.S. PATENT DOCUMENTS

| | | | | |
|---|---|---|---|---|
| 7,415,367 B2* | 8/2008 | Williams | ............... | H04N 17/00 348/192 |
| 8,271,220 B2* | 9/2012 | Diepenbrock | ...... | G01R 31/2837 702/69 |
| 9,215,101 B2* | 12/2015 | Hart | ..................... | H04L 25/0278 |
| 9,414,126 B1* | 8/2016 | Zinevich | .................. | H04B 3/46 |
| 10,185,020 B1* | 1/2019 | Okuyama | .............. | G01R 31/11 |
| 2005/0194981 A1* | 9/2005 | Cole | ...................... | G01R 27/28 324/638 |
| 2005/0234662 A1* | 10/2005 | Niedzwiecki | ........ | G01R 35/005 702/60 |

(Continued)

Primary Examiner — Dibson J Sanchez
(74) Attorney, Agent, or Firm — Armstrong Teasdale LLP

(57) ABSTRACT

A method is provided for calibrating a terminal device connected to a transmission line containing an impairment. The method includes steps of obtaining a sequence of frequency domain samples for a digital signal transmitted to the terminal device, determining a reflection coefficient from the obtained frequency domain sequence and a reflection signal arising from the impairment, converting the sequence of frequency domain samples and the frequency domain reflection signal into the time domain to generate a complex time domain sample sequence having a real I time component and an imaginary Q time component, correcting the time domain sample sequence into a corrected time sequence having a phase value of the Q component corresponding to a phase value of the I component, calculating a correcting spin coefficient from the corrected time sequence, and calibrating the terminal device with the correcting spin coefficient to mitigate a rotation of the reflection coefficient.

20 Claims, 8 Drawing Sheets

(56) References Cited

U.S. PATENT DOCUMENTS

| | | | |
|---|---|---|---|
| 2005/0238037 A1* | 10/2005 | Dodds | H04L 43/50 370/420 |
| 2006/0164066 A1* | 7/2006 | Shioiri | G01R 31/2813 324/76.22 |
| 2007/0073499 A1* | 3/2007 | Sawyer | G01R 35/005 702/75 |
| 2009/0245476 A1* | 10/2009 | Lindqvist | H04B 3/48 379/32.04 |
| 2016/0103197 A1* | 4/2016 | Schultz | G01R 27/32 324/601 |
| 2016/0139194 A1* | 5/2016 | Cohen | G01R 31/088 324/533 |
| 2016/0337512 A1* | 11/2016 | Kalavai | H04B 3/48 |
| 2017/0019172 A1* | 1/2017 | Yang | H04B 10/6163 |
| 2017/0104522 A1* | 4/2017 | Zinevich | H04B 10/071 |
| 2017/0199235 A1* | 7/2017 | Jeon | G01R 31/11 |
| 2017/0294960 A1* | 10/2017 | Williams | H04B 10/0775 |
| 2017/0373749 A1* | 12/2017 | Williams | H04B 10/0775 |
| 2019/0094289 A1* | 3/2019 | Incarbone | G01R 31/085 |
| 2020/0072895 A1* | 3/2020 | Auzanneau | G01R 31/088 |
| 2020/0116777 A1* | 4/2020 | Cabanillas | G01R 31/08 |
| 2021/0141011 A1* | 5/2021 | Ben Hassen | G01R 31/083 |

* cited by examiner

SYSTEMS AND METHODS FOR DETERMINING REFLECTION AND TRANSMISSION COEFFICIENTS

CROSS REFERENCE TO RELATED APPLICATIONS

This application claims the benefit of and priority to U.S. Provisional Patent Application Ser. No. 63/032,987, filed Jun. 1, 2020, the disclosure of which is herein incorporated by reference in its entirety.

BACKGROUND

The field of the disclosure relates generally to digital transmission systems, and more particularly, to multi-carrier wired, wireless, and optical digital transmission systems.

Conventional digital transmission systems often exhibit both linear and non-linear distortion. Conventional digital transmission systems utilize symbols with coefficients, either in the time domain (TD) or frequency domain (FD), which are generally complex-value sequences. That is, the coefficients of the complex symbols typically include both a real (Re) component and an imaginary (Im) component, or alternatively, a magnitude and a phase value. The time and frequency domains of the transmission systems are related and, for a plot or a sequence of numerical values, it must be known whether to observe the plotted numbers as time domain or frequency domain values. This distinction is of particular significance when considering multi-carrier (MC) digital transmissions, such as with orthogonal frequency division multiplexing (OFDM) and orthogonal frequency division multiple access (OFDMA) transmissions.

OFDM symbols, for example, when plotted, appear as discrete values in the frequency domain, but look more like random noise in the time domain. In contrast, if a transmission is single carrier (SC), its symbols can be viewed as discrete values in the time domain, but look like random noise in the frequency domain. Multi-carrier and single carrier transmissions are thus typically viewed in different domains.

One type of interference/distortion that severely affects digital transmissions is multipath linear distortion, which is sometimes referred to as "reflections," "echoes," "ghosts," or "dispersion." An example of such distortion occurs when a data transmission (e.g., a baseband radio frequency (RF) signal) is sent over a direct path between a transmitter and a receiver, but is also reflected off at least one object or impedance mismatch outside of the direct path. In such cases, the receiver receives the main signal of the direct path, but also a reflection of the signal over the indirect reflection path. Such reflections combine with the main signal over the direct path, thereby causing distortion in the received signal.

On wired signal paths, reflections may also occur from impedance mismatches within coaxial networks, such as in the case where one or more copies of the original signal, which may include a delay and/or an attenuation, are added to the original signal. In comparison, on wireless signal paths, multipath linear distortion may arise from signals reflected off of physical structures.

Where the wired signal path includes single mode fiber optic coherent optical signals, on the other hand, the transmission characteristics differ from RF wired and wireless signal paths. That is, for a single mode glass fiber, impairments such as Chromatic Dispersion (CD), which is similar to group delay, may occur at lower frequencies, since signals at different frequencies (e.g., optical wavelengths) travel at different speeds down the fiber optic cable, and the linear distortion therefrom is typically equalized to minimize intersymbol interference (ISI). This impairment becomes more pronounced with longer fiber optic cable spans and increasing bandwidth, and is different from echoes, which are not typically encountered on fiber optic transport media. Some distortion equalization systems and methods are described in greater detail in co-pending U.S. patent application Ser. No. 16/927,802, filed Jul. 13, 2020, the subject matter and disclosure thereof which is incorporated by reference herein. The following description may broadly refers to such distortions and impairments collectively as "interference(s)."

More particularly, as most easily seen on a Smith Chart, the F magnitude of a reflection coefficient of a reflection may remain constant over a length of a transmission line, but the F phase of reflection coefficient will change over that same length. On a conventional Smith Chart (i.e., a standard tool for analysis of transmission lines, filters, and matching circuits used to plot the reflection coefficient F against frequency in a complex plane), this reflection coefficient will be seen as a constant-radius rotation, or spin from a point representing a load value for F. The longer the length of cable in question, the faster the spin on reflection coefficient. To compensate for this rotation, conventional techniques require a technician to perform an on-site calibration procedure at the modem using a specified, known length of drop cable (e.g., 100 ft) connected to the modem. It is therefore desirable to be able to calibrate the downstream device without requiring a costly on-site technician visit.

In the case of a cable system, the length $L_D$ is unknown and thus cannot be corrected for the modem without such on-site drop-cable procedures. Thus, the angle, or spin, of the reflection coefficient cannot be determined remotely in the conventional system. Knowing the angle of the reflection coefficient provides useful knowledge to the network operator, not only with regard to the location of damage to the transmission line, but also regarding the nature of such damage. For example, an open circuit measurement (hereinafter, "an open") may indicate that possibly a coaxial shield has been broken, a termination screw became or was left untightened, or a center pin was not making contact in a connector. In contrast, a short circuit measurement (hereinafter, "a short") might indicate that a cable has possibly been crushed, thereby pushing the shield into contact with the center conductor.

It is therefore further desirable to able to determine, from captured spectrum data on the transmission line, both the magnitude and phase of the reflection coefficient from various particular points along the transmission path so that both the location and the nature of damage to the transmission line may be easily determined without costly on-site technician testing.

BRIEF SUMMARY

In an embodiment, a method is provided for calibrating a terminal device connected to a transmission line containing at least one impairment. The method includes a step of obtaining a sequence of frequency domain samples for a digital signal transmitted to the terminal device over the transmission line. The method further includes a step of determining, from the obtained frequency domain sequence, a reflection coefficient from a frequency domain reflection signal of the digital signal arising from the at least one impairment. The method further includes a step of converting the sequence of frequency domain samples and the frequency domain reflection signal into the time domain to generate a complex time domain sample sequence having a real I time component and an imaginary Q time component. The method further includes a step of correcting the time domain sample sequence into a corrected time sequence having a phase value of the Q time component corresponding to a phase value of the I time component. The method further includes steps of calculating a correcting spin coefficient from the corrected time sequence, and calibrating the terminal device with the spin coefficient to mitigate a rotation of the reflection coefficient.

In an embodiment, a network analyzer is coupled with a transmission line of a digital communication network. The network analyzer includes a processor in operable communication with the transmission line, and a memory device for storing computer-executable instructions. The instructions, when executed by the processor, cause the processor to obtain a sequence of frequency domain samples for a digital signal transmitted over the transmission line to a downstream terminal device, and determine, from the obtained frequency domain sequence, a reflection coefficient of a frequency domain reflection signal arising from a physical impairment of the transmission line disposed between the network analyzer and the downstream terminal device. The instructions further cause the processor to convert the sequence of frequency domain samples and the frequency domain reflection signal into the time domain to generate a complex time domain sample sequence having a real I component and an imaginary Q component in the time domain, calculate a correcting spin coefficient from the corrected time sequence, and instruct the downstream terminal device calibrate a rotation of the reflection coefficient arising from the physical impairment using the calculated correcting spin coefficient.

BRIEF DESCRIPTION OF THE DRAWINGS

These and other features, aspects, and advantages of the present disclosure will become better understood when the following detailed description is read with reference to the following accompanying drawings, in which like characters represent like parts throughout the drawings.

Figure 1:
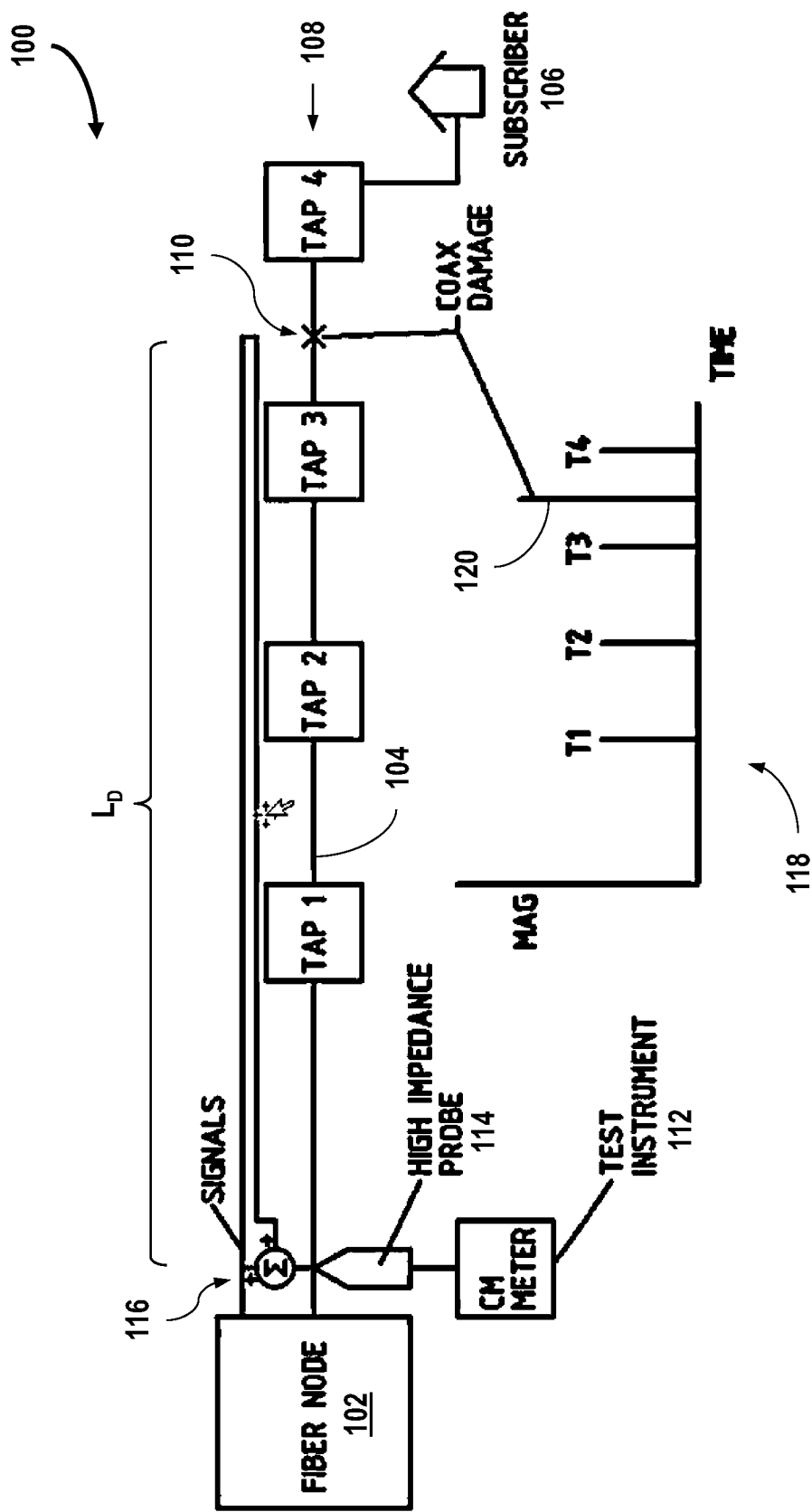
FIG. 1 is a schematic illustration depicting a wired transmission system.

Unless otherwise indicated, the drawings provided herein are meant to illustrate features of embodiments of this disclosure. These features are believed to be applicable in a wide variety of systems including one or more embodiments of this disclosure. As such, the drawings are not meant to include all conventional features known by those of ordinary skill in the art to be required for the practice of the embodiments disclosed herein.

DETAILED DESCRIPTION

In the following specification and the claims, reference will be made to a number of terms, which shall be defined to have the following meanings.

The singular forms "a," "an," and "the" include plural references unless the context clearly dictates otherwise.

"Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value. Here and throughout the specification and claims, range limitations may be combined and/or interchanged; such ranges are identified and include all the sub-ranges contained therein unless context or language indicates otherwise.

As used herein, the terms "processor" and "computer" and related terms, e.g., "processing device", "computing device", and "controller" are not limited to just those integrated circuits referred to in the art as a computer, but may also broadly refer to a microcontroller, a microcomputer, a programmable logic controller (PLC), an application specific integrated circuit (ASIC), and other programmable circuits, and these terms are used interchangeably herein. In the embodiments described herein, memory may include, but is not limited to, a computer-readable medium, such as a random access memory (RAM), and a computer-readable non-volatile medium, such as flash memory. Alternatively, a floppy disk, a compact disc-read only memory (CD-ROM), a magneto-optical disk (MOD), and/or a digital versatile disc (DVD) may also be used. Also, in the embodiments described herein, additional input channels may be, but are not limited to, computer peripherals associated with an operator interface such as a mouse and a keyboard. Alternatively, other computer peripherals may also be used that may include, for example, but not be limited to, a scanner. Furthermore, in the exemplary embodiment, additional output channels may include, but not be limited to, an operator interface monitor.

Further, as used herein, the terms "software" and "firmware" are interchangeable, and include any computer program storage in memory for execution by personal computers, workstations, clients, and servers.

As used herein, the term "non-transitory computer-readable media" is intended to be representative of any tangible computer-based device implemented in any method or technology for short-term and long-term storage of information, such as, computer-readable instructions, data structures, program modules and sub-modules, or other data in any device. Therefore, the methods described herein may be encoded as executable instructions embodied in a tangible, non-transitory, computer readable medium, including, without limitation, a storage device and a memory device. Such instructions, when executed by a processor, cause the processor to perform at least a portion of the methods described herein. Moreover, as used herein, the term "non-transitory computer-readable media" includes all tangible, computer-readable media, including, without limitation, non-transitory computer storage devices, including, without limitation, volatile and nonvolatile media, and removable and non-removable media such as a firmware, physical and virtual storage, CD-ROMs, DVDs, and any other digital source such as a network or the Internet, as well as yet to be developed digital means, with the sole exception being a transitory, propagating signal.

As used herein, unless specified to the contrary, "modem termination system," or "MTS'" may refer to one or more of a CMTS, an optical network terminal (ONT), an optical line terminal (OLT), a network termination unit, a satellite termination unit, and/or other termination devices and systems. Similarly, "modem" may refer to one or more of a CM, an optical network unit (ONU), a digital subscriber line (DSL) unit/modem, a satellite modem, etc.

As used herein, the term "database" may refer to either a body of data, a relational database management system (RDBMS), or to both, and may include a collection of data including hierarchical databases, relational databases, flat file databases, object-relational databases, object oriented databases, and/or another structured collection of records or data that is stored in a computer system.

Furthermore, as used herein, the term "real-time" refers to at least one of the time of occurrence of the associated events, the time of measurement and collection of predetermined data, the time for a computing device (e.g., a processor) to process the data, and the time of a system response to the events and the environment. In the embodiments described herein, these activities and events occur substantially instantaneously.

The embodiments described herein provide innovative systems and methods for efficiently determining reflection and transmission coefficients such that, in the case of an impairment or interference on the transmission line, signal correction may be advantageously performed at the end user termination device, as well as elsewhere along the transmission path. In an exemplary embodiment, full band capture (FBC) is performed by a network analyzer disposed at a fiber node of a wired communication network. In some embodiments, FBC is performed at a hub MTS, or between the MTS and an end-user modem by a standalone dedicated network analysis hardware unit, or virtually through a software module of a processor programmed for implementing network analysis of the spectral frequency transmitted along the transmission path.

FIG. 1 is a schematic illustration depicting a wired transmission system 100. Transmission system 100 represents a cable transmission infrastructure or a hybrid fiber coaxial (HFC) network, and includes a fiber node 102, which may be connected downstream of a communications hub, optical line terminal (OLT), modem termination system (MTS), and/or central office (not shown in FIG. 1). Fiber node 102 is additionally connected to a data transmission line 104 for further transmission to a plurality of end users 106 in communication with data transmission line 104 over a plurality of taps 108, respectively, disposed along a length of data transmission line 104. Data transmission line 104 is depicted in FIG. 1 as a coaxial cable for ease of explanation. End users 106 represent downstream termination units, such as a subscriber device, a modem, a cable modem (CM), customer premises equipment (CPEs), a business user link, and/or an optical network unit (ONU). For simplicity of explanation, one end user 106 is depicted in FIG. 1.

In operation of system 100, data transmission line 104 is damaged at a damage location 110 located between fiber node 102 and end user 106 (between third and fourth taps 108, according to the example depicted in FIG. 1). A technician (not shown) runs a test on transmission line 104 to detect damage location 110 using a test instrument 112 (including a high impedance probe 114), or a radar test set. A network analyzer 116 measures a time domain response 118 of the test signal, which exhibits a particular energy recursion 120 corresponding to the damage to data transmission line at damage location 110, which is disposed a damage-to-analyzer distance $L_D$ with respect to the disposition of network analyzer 116.

In additional operation of system 100, network analyzer 116 also measures the reflection coefficient F, or gamma, of the test signal, and plots the measured reflection coefficient on a Smith Chart, as described further below with respect to FIG. 2. That is, the Smith Chart may be used here as a tool for visualizing the impedance of a transmission line (or antenna system) as a function of frequency.

Figure 2:
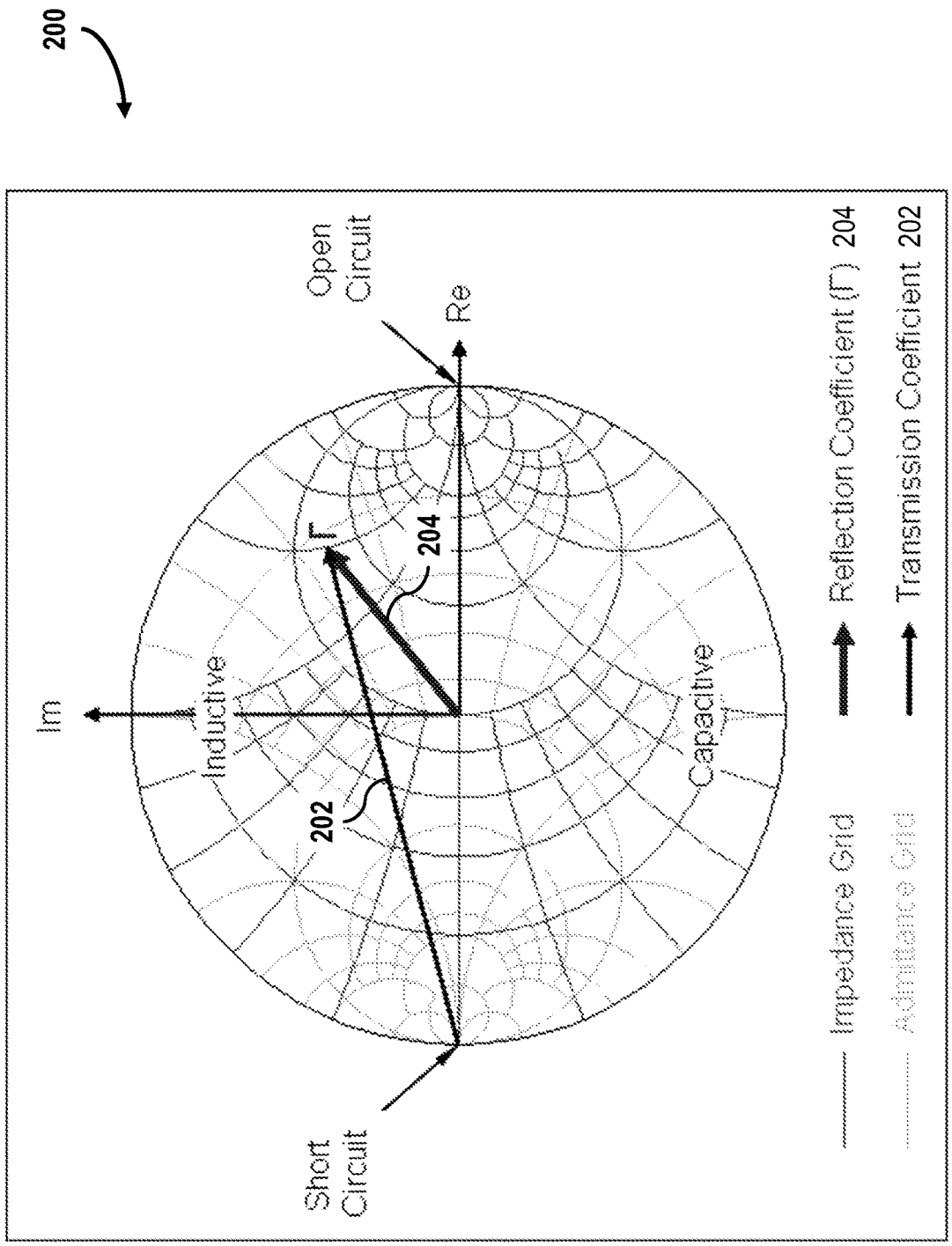
FIG. 2 is a graphical illustration depicting a Smith Chart plot of the particular energy recursion depicted in FIG. 1.

FIG. 2 is a graphical illustration depicting a Smith Chart plot 200 of energy recursion 120, FIG. 1. Plot 200 represents a combined impedance grid (i.e., right-to-left) and admittance grid (i.e., left-to-right), and depicts a transmission coefficient 202 and a reflection coefficient 204 of the measured energy recursion 120. However, as in the scenario depicted in FIG. 1, where the length $L_D$ of the cable (i.e., portion of data transmission line 104) connected to network analyzer 116 is not known, the nature of the measured reflection may not be determined from the frequency-based reflection coefficient 204 without performance of an additional on-site calibration to remove the effects of the cable (e.g., an on-site drop-cable test).

More particularly, as described above the F magnitude of reflection coefficient 204 may remain constant over a length of transmission line 104, but the F phase of reflection coefficient 204 will change, that is, rotate or spin, according to the length of transmission line. On a conventional Smith Chart representation therefore, reflection coefficient 204 will be seen as a constant-radius rotation from a point representing a load value for F. This rotation, or spin, represents a change in phase of the complex number, and is a rotation at constant radius because the magnitude of the reflection coefficient remains constant. The longer the length of cable in question, the faster the spin on reflection coefficient 204. To compensate for this spin in a conventional system, sometimes referred to as "de-spinning F," the on-site calibration must be performed at the terminating modem using a specified, known length of drop cable (e.g., 100 ft) connected to the modem. As also described above, this process is resource intensive, requires the technician to be present at the site of the modem. This challenge is overcome according to the embodiments described further below.

Figure 3:
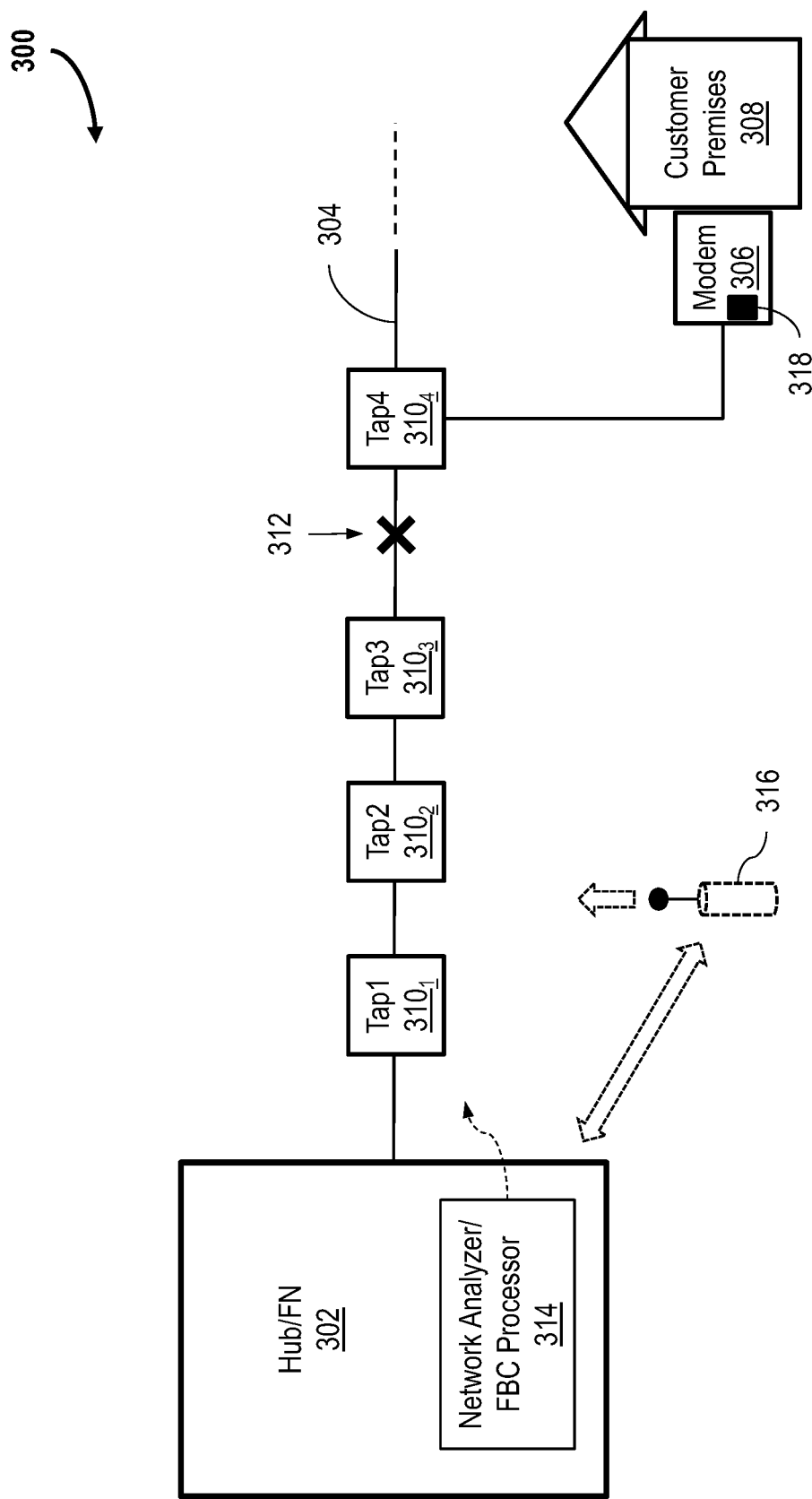
FIG. 3 is a schematic illustration depicting an exemplary wired transmission system, in accordance with an embodiment.

FIG. 3 is a schematic illustration depicting an exemplary wired transmission system 300. Similar to transmission system 100, FIG. 1, exemplary system 300 includes a fiber node or communications hub 302 connected to a data transmission line 304 for transmission to a plurality of end user termination devices 306 proximate or co-located at respective customer premises 308. In the exemplary embodiment depicted in FIG. 3, end user termination device is illustrated as a single modem for ease of explanation. The person of ordinary skill in the art though, will understand that different, and/or additional termination devices may be implemented without departing from the scope of the embodiments described herein.

In an exemplary embodiment, modem 306 is connected to a respective tap 310 disposed along data transmission line 304 (Tap4 310$_4$, in this example) downstream of a line impairment 312 (e.g., damage to a coaxial cable) from which at least one reflection signal arises. Similar to system 100, exemplary system 300 further includes a network analyzer 314 having a processor and a memory (not separately shown) configured to measure or obtain the spectral frequency response of data transmission line 304 (e.g., FIG. 5, discussed further below).

In the exemplary embodiment illustrated in FIG. 3, network analyzer 314 is shown to be disposed within or co-located with hub/fiber node 302. In some embodiments, network analyzer 314 may be disposed remotely from hub or fiber node 302 along data transmission line 304 between hub/node 302 and modem 306. Optionally, network analyzer 314 may cooperate with an external testing device 316 (e.g., a high impedance probe connected to a spectrum analyzer or data acquisition device, such as a software defined radio (SDR) or analog-to-digital converter (ADC) in communication with network analyzer 314) in contact with data transmission line 304.

Different though, from system 100, network analyzer 314 is further configured to advantageously utilize technology recently developed by the present Assignee with respect to FBC proactive network maintenance (PNM) techniques implemented for Data Over Cable Service Interface Specification (DOCSIS) v3.1, in which magnitude traces of the spectral frequency band of the transmission are captured. Systems and methods for such innovative PNM techniques are described in greater detail in co-pending U.S. patent application Ser. No. 15/651,971, filed Apr. 12, 2018, the subject matter and disclosure thereof which is incorporated by reference herein. The following embodiments illustrate further innovations to modify this existing captured data to de-spin the reflection coefficient at the modem site without requiring a drop-cable technician on-site calibration.

In exemplary operation of system 300, network analyzer 314 captures the spectral data of transmission line 304 (e.g., FIG. 5, below). In an exemplary embodiment network analyzer 314 functions as a measuring device for measuring the captured spectral frequency data, and also as a processing device for analyzing the captured spectral data to calculate a calibration correction at a remote location. In some embodiments, the actual measurement of the spectral data may be performed by a separate measuring device, and the data thereof communicated to network analyzer 314. In at least one embodiment, data analysis may be performed remotely by a third party processor in communication with at least one of hub/node 302 and modem 306, such as in the case of a Cloud network processing system or an Internet web services host.

In an embodiment, network analyzer 314 represents a spectrum analyzer and/or a data acquisition device directly or indirectly brought into contact with transmission line 306 while operational. The analyzer/acquisition device thus is able to observe, for example, standing waves having a reflection on the transmission path (e.g., arising from linear addition and subtraction of signals at different frequencies, caused by two signals traveling in opposite directions along transmission line 306).

Exemplary equalization systems and methods are described in greater detail in co-pending U.S. patent application Ser. No. 15/481,135, filed Apr. 6, 2017, the subject matter and disclosure thereof which is incorporated by reference herein. U.S. U.S. patent application Ser. No. 15/481,135, for example, discloses innovative techniques for transforming complex frequency signals into the time domain by assuming that the imaginary values for a transmitted cable signal are zero, with the corresponding real values being measured signal magnitudes only. That is, in this co-pending application, the complex data points need not be captured, and instead simply the real magnitude values. The present disclosure expands on this time domain vs. frequency domain concept through innovative techniques for analyzing F vs. Time, as opposed to the conventional techniques that only consider that is F with respect to Frequency. This innovative concept is further described with respect to FIGS. 4A and 4B, below.

The following embodiments are described below with respect to networks and systems for which spectral band capture is performed. The person of ordinary skill in the art will understand that these examples are provided for illustrative purposes, and are not intended to be limiting. The present techniques may be applied to a number of other applications, including without limitation, wired communications (e.g., cable or fiber, wired MIMO), wireless (e.g., radar, wireless MIMO), recording, signal detection, and interfering signal rejection.

Figure 4B:
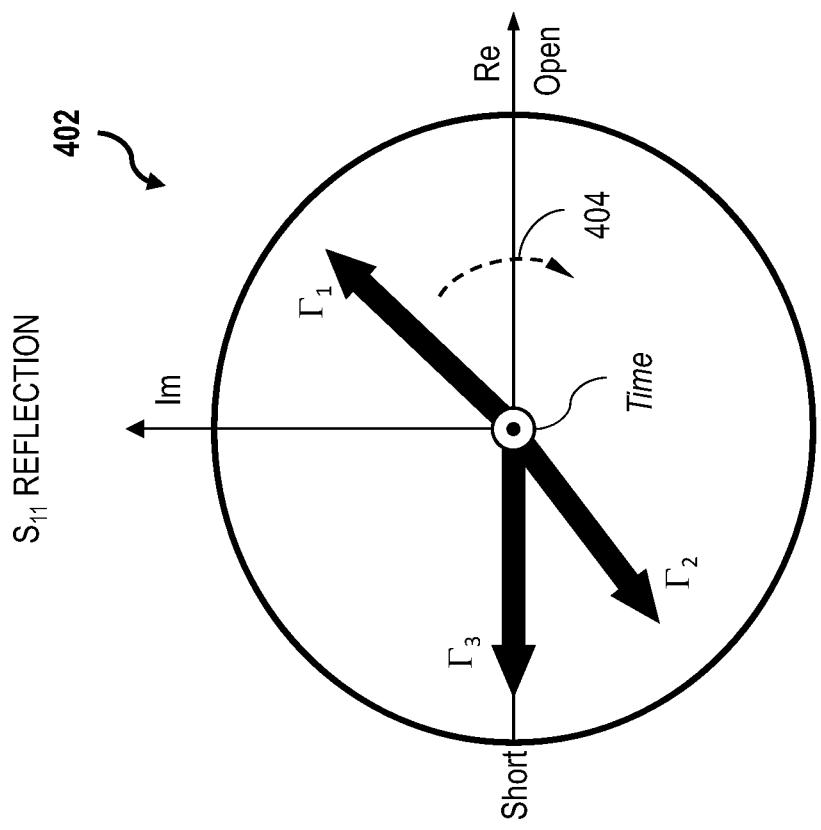
FIGS. 4A-B are graphical illustrations depicting Smith Chart plots for the transmission and reflection signals, respectively, measured by the system depicted in FIG. 3.
Figure 4A:
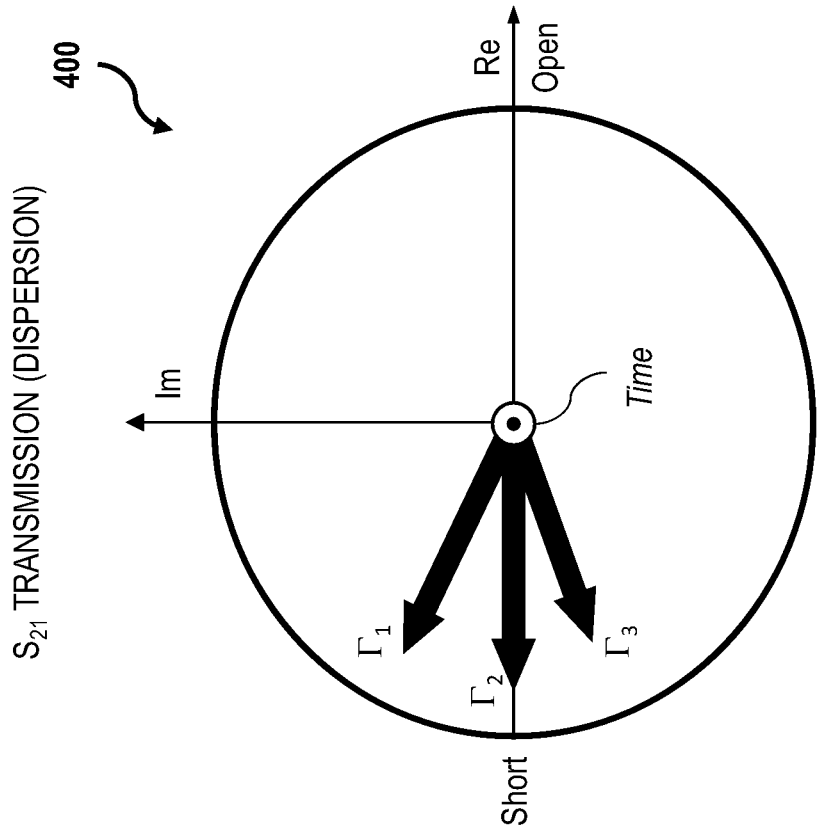

FIGS. 4A and 4B are graphical illustrations depicting a transmission Smith Chart plot 400 and a reflection Smith Chart plot 402, respectively, for the signals measured by system 300, FIG. 3. More particularly, transmission Smith Chart plot 400 illustrates a simplified complex plot of scattering parameter $S_{21}$ (i.e., the forward transmission coefficient), and reflection Smith Chart plot 402 illustrates a simplified complex plot of scattering parameter S (i.e., the input reflection coefficient). As can be seen from plot 402, the reflected signal has multiple reflections. On the other hand, as seen from plot 400, the transmitted signal is dispersed (e.g., the resulting pattern from signal path delays). However, when considering only the frequency data of a conventional Smith Chart, a spin 404 of a particular coefficient cannot be determined.

Accordingly, whereas a conventional Smith Chart only plots reflection coefficients against frequency, the present embodiments demonstrate how such complex responses may also be plotted with respect to time. In this regard, it is helpful to visualize a time axis for plots 400, 402 as being perpendicular to the two-dimensional plane of the respective Smith Chart, and increasing in time magnitude in the direction away from the viewer. A F-vs-time analysis may thus be achieved, for example, by performing an inverse Fourier transform (IFT), or inverse fast Fourier transform (IFFT) or inverse discrete Fourier transform (IDFT), on the captured spectral frequency data and plotting the inverse-transformed data accordingly, and a cursor on a peak may show time delay, magnitude, and phase angle of the respective reflection. It may be noted that some such responses might be considered, at a distance, to be reactive, inductive, or capacitive.

In other words, a plot of the IFT of the network response (i.e., F vs. time) on a Smith Chart would render the center of the plot as indicating no reflected signal from a given time window, while the left-most boundary still represents a short and the right-most boundary still represents an open (both from the given time window). As a cursor moves across, or more aptly, into, the plot with increased time, the plotted response will move away from the middle of the traditional two-dimensional Smith Chart plane in the direction of the impedance mismatch at the distance at issue. This expansion of the conventional coefficient parameters will not only greatly increase the ability of a technician to troubleshoot a defective plant problem using reflection coefficients, but it will further avoid the need, in many cases, for the technician to have to calibrate the affected modems on-site. The dispersion and associated angle for each signal path may thus be further shown (e.g., three-dimensional plot of the transmission coefficient shown in plot 402, FIG. 4B), along with a relevant time of signal arrival.

Thus, at a high level, the present embodiments may be considered to effectively utilize innovative principles for generating a "dynamic Smith Chart," namely. a three-dimensional Smith Chart having time as an axis perpendicular to the traditional Smith Chart plane (i.e., a Smith-Chart-over-time). As demonstrated by the techniques described further below, the "dynamic Smith Chart" concept enables a calculation of a "spin coefficient", and remotely from the terminal device itself (or at the terminal device, but without requiring a separate drop-cable calibration procedure), which may be used to "de-spin" the transmission/reflection coefficients plotted on conventional Smith Charts.

In other words, whereas conventional techniques enable the network analyzer to establish a calibration plane (e.g., a Smith Chart) for calibration with a known reference (e.g., a drop cable), the present calibration techniques function to correct the calibration plane remotely, effectively extending conventional parameters by enabling the determination of both the distance from the reflection and the spin coefficient without requiring an on-site reference test by a technician to stop the spin.

According to the present systems and methods, the terminal device or modem may be easily instructed to make the calibration according to the remotely-calculated (or self-calculated) de-spinning spin coefficient. The relevant spectral measurements and de-spin calculations may be made remotely from the modem, and the modem simply instructed to make the necessary correction according to the remote measurements and/or spin calculations. In some embodiments, the modem may be advantageously programmed to automatically make such corrections based on the obtained spectral data or FBC, thereby effectively rendering the modem its own testing device.

In some embodiments, the reflection data may be obtained using a Time Domain Reflectometer (TDR), which is a baseband instrument. At a given distance, an open will deflect the trace therefrom upward, whereas a short will deflect the trace downward. By looking at frequency domain data as the measurement frequency approaches DC (i.e., 0 Hz), a reflection coefficient may be estimated from the TDR observations. With network measurements, a DC response is often not possible as low frequency signals are not passed by the network. For example a typical downstream cable amplifier bandwidth is approximately 54 MHz at the lower end thereof. A waveguide is another example of a device which does not pass low frequencies. TDR measurements though, often require that the network be taken down, that is, go off-line or out-of-service, so that a test signal may be accurately transmitted and measured along the transmission path thereof. As described herein, the present techniques may be advantageously implemented for an in-service transmission network.

Thus, in an exemplary embodiment, in the case where a noise-like signal (such as a digital transmission) is combined with a delayed copy of itself, the magnitude of the combined signals will add to or subtract from one another, depending on the particular frequency of overlap. In the case where the frequencies are exactly known, the reflection coefficient of the added signal may be determined by heterodyning the signal down to DC (e.g., FIG. 6, described further below), followed by a phase correction (e.g., FIG. 7, described further below). For this exemplary embodiment, the phase correction may be based on both the duration of the time delay, as well as the frequency offset. In the exemplary embodiment, these innovative techniques effectively convert an RF measurement into a baseband measurement, and thereby more accurately revealing the reflection coefficient (s).

According to the systems and methods described herein, a technician, network analyzer, hub/node processor, and/or modem processor is advantageously enabled to remotely (and also locally) determine the phase of a reflection from the calculated spin coefficient, and irrespective of whether an impairment to the transmission line is from a short or an open, or whether inductive or capacitive. Indeed, using the spin coefficient calculation, a technician may be enabled to more accurately estimate the nature of the impairment prior to inspection, as opposed to the location only.

In an alternative embodiment, the phase of the reflection coefficient, and thus the spin coefficient, may be determined by extrapolating a rotating-phasor of frequency response (e.g., FIG. 5, below) back to DC, and then detecting whether the extrapolated rotating-phasor resulted at +90 degrees, — 90 degrees, or some other angle. In other words, this alternative technique effectively follows the screw-like rotational path downward to the DC floor.

In accordance with the several techniques described herein, it is observed that an increase in time delay will cause a phase rotation of frequency domain coefficients. In a similar manner, a change in frequency (e.g., heterodyning) will cause a phase rotation of the time domain coefficients.

In a particular illustrative example, a measured linear channel response is represented as F(n), and from a first frequency value f1 to a second frequency value f2. In this example, for ease of explanation, f1 is set to a zero value, and each additional time series coefficient, f[k], may be calculated according to the following conventional IDFT equation:

$$f[k] = \frac{1}{N}\sum_{n=0}^{N-1} F[n]e^{+j\frac{2\pi}{N}nk} \quad (\text{Eq. 1})$$

Thus, in the case where f1 is zero, the equation yields the correct answer. However, in the case where f1 is not 0 Hz, each time sample f[k] will have a phase error, per time sample, equal to $2\pi*SC/N$ radians, where SC is an integer index number of subcarriers needed to adjust f1[0] to 0 Hz, and N is the FFT size.

In a specific illustrative example, network analyzer 314 obtains available spectrum data for an OFDMA channel having 720 subcarrier predistortion coefficients available every 50 KHz, e.g., from 5.75 MHz to 41.75 MHz. Accordingly, the "0 Hz" coefficient for f1, if it were available, would be is 115 frequency domain samples below 5.75 MHz. Therefore, beginning at 5.75 MHz, and using an FFT size of 512, the phase correction for each subcarrier, per time sample, would be $2\pi*SC/512$ radians. Thus, to get back to 0 Hz, the integer index number SC would be 115 (i.e., SC=215) if beginning the first sample, but 215 if beginning on the $100^{th}$ sample (i.e., SC=215).

Exemplary processing steps for obtaining the spin coefficient are described further below with respect to FIGS. 5-8. In an exemplary embodiment, these processing steps may be implemented with respect to transmission system 300, FIG. 3, one or more of the several elements therein, a transmission system implementing a DOCSIS protocol, or a digital transmission system implementing a non-DOCSIS OFDM or OFDMA protocol.

In exemplary operation, processing steps to determine a spin coefficient may include one or more of: (a) measuring a complex signal level against frequency; (b) adjusting the start frequency of the measured signal to DC (e.g., 0 Hz), such as by way of digital signal processing (DSP) and/or heterodyning; (c) perform an IFT/IFFT on the measured signal to convert frequency domain samples into time domain samples; (d) correct the phase on each converted time domain sample using time value(s) and/or frequency shift(s); and (e) determine a corrected reflection coefficient for each corrected time domain sample to de-spin the reflection coefficient. Optionally, an additional processing step may convert the corrected complex time domain sequence (i.e., real and imaginary values) to a real-value-only time domain sequence for increased resolution and accuracy. For example, to obtain a more accurate phase value for the first such time domain sample, beginning again at subcarrier 115 (i.e., SC=115) 1.411 radians may be added to this first time domain sample, 2.822 radians to the second time domain sample, and so forth.

In an exemplary embodiment, the present terminal device/modem correction techniques may be accomplished in coordination with computer code or executable instructions, for example, such as that as shown below with respect to the executable code listed in the attached Computer Program Listing. Additional embodiments, variations, and real-world proof-of-concept simulation results of these exemplary processing steps are described further below with respect to FIGS. 5-7.

Figure 5:
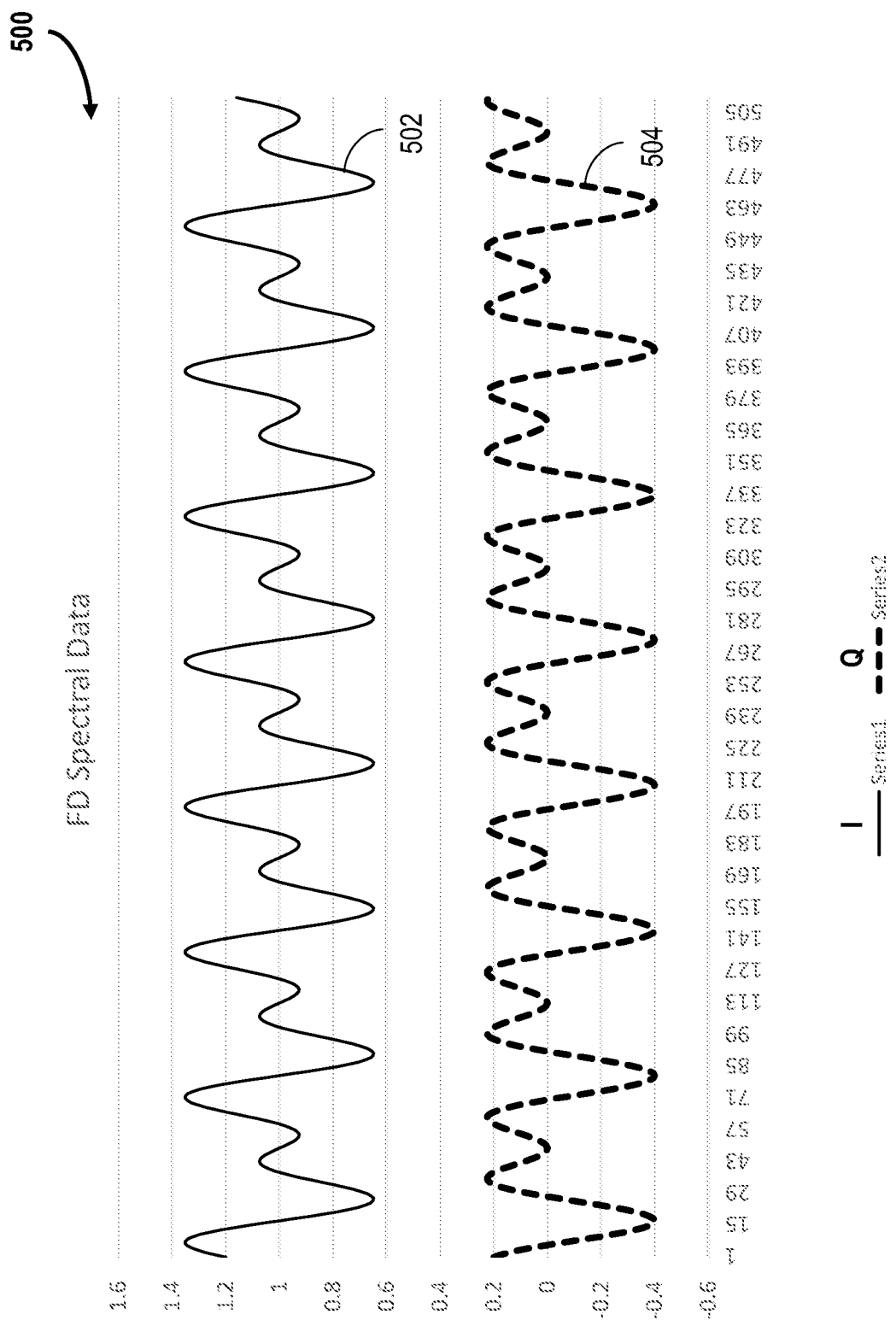
FIG. 5 is a graphical illustration depicting a comparative plot of simulated frequency spectral data captured by the network analyzer depicted in FIG. 3.

FIG. 5 is a graphical illustration depicting a comparative plot 500 of simulated frequency spectral data captured by network analyzer 314, FIG. 3. More particularly, comparative plot 500 includes a first subplot 502 (Series1, solid line) and a second subplot 504 (Series2, dashed line), respectively illustrating test results of 512 sampled I (real) and Q (imaginary) complex spectral data points selected from a captured 1024-point frequency domain simulated sequence set of 1024 points, beginning at 0 Hz. That is, the phases are correct at 0 Hz; however, as described above, a selected subset starting point may be selected from any random frequency between 0 and 512, which is particularly valuable for networks that do no operate below 54 MHz. For example, a start frequency could be 100 MHz, and the end frequency would then be 612 MHz. In the exemplary test case shown in FIG. 5, a real echo of 20% was added at t=8 samples, and an imaginary echo of 20% was added at t=16 samples.

In the exemplary embodiment, the spectral data samples are measured (i.e., sampled) by network analyzer co-located with the hub or fiber node. However, as described above, in other embodiments, network analyzer 314 need only obtain the spectral data from a sampling unit contacting the transmission line at some testing point from the termination unit/modem to the hub or node. The sampling unit may be integral with network analyzer 314, or may be a separate device disposed remotely from network, analyzer 314. In at least one embodiment, the testing point may be proximate the modem. Nevertheless, the present embodiments advantageously remove the need to co-locate the testing point (e.g., the sampling unit) with the correction point (e.g., the modem). In some instances, the sampled spectral data may be obtained from a device already dedicated to measure and sample the frequency spectrum of the transmission line, such as a DOCSIS 3.1 FBC PNM unit.

The versatility of this configuration for spectral capture thus enables the present techniques to be easily implemented or coordinated with existing fiber node and/or wired transmission architectures with minimal additional hardware and programming costs. System 300 may thus further advantageously function as a standalone system, or may be fully backwards-compatible with existing modem, fiber node, and MTS systems presently in use.

The present coefficient expansion techniques of system 300 are further also fully compatible with the extended spectrum of DOCSIS 3.1, and particularly in the case where it is desirable to perform data collection and/or analysis at a different location from where the calibration/correction occurs (e.g., the modem). Such distributed calibration/correction techniques may be particularly desirable where the cost-benefit weigh in favor of collecting the data at one location (e.g., network analyzer, modem, or a testing instrument, such as a TDR), analyzing the sampled data at another location (e.g., network analyzer, modem, or Cloud/Internet-based web services), and then performing the necessary correction calibration at the target termination device/modem. The present correction/calibration techniques are thus further advantageous in the case where both the data analysis and correction are performed at the modem (assuming sufficient programming and processing power of modem processor 318, FIG. 3), in that spectral capture and sampling may be easily performed at a central location without requiring technician travel to the modem location and perform a drop-cable test.

Figure 6:
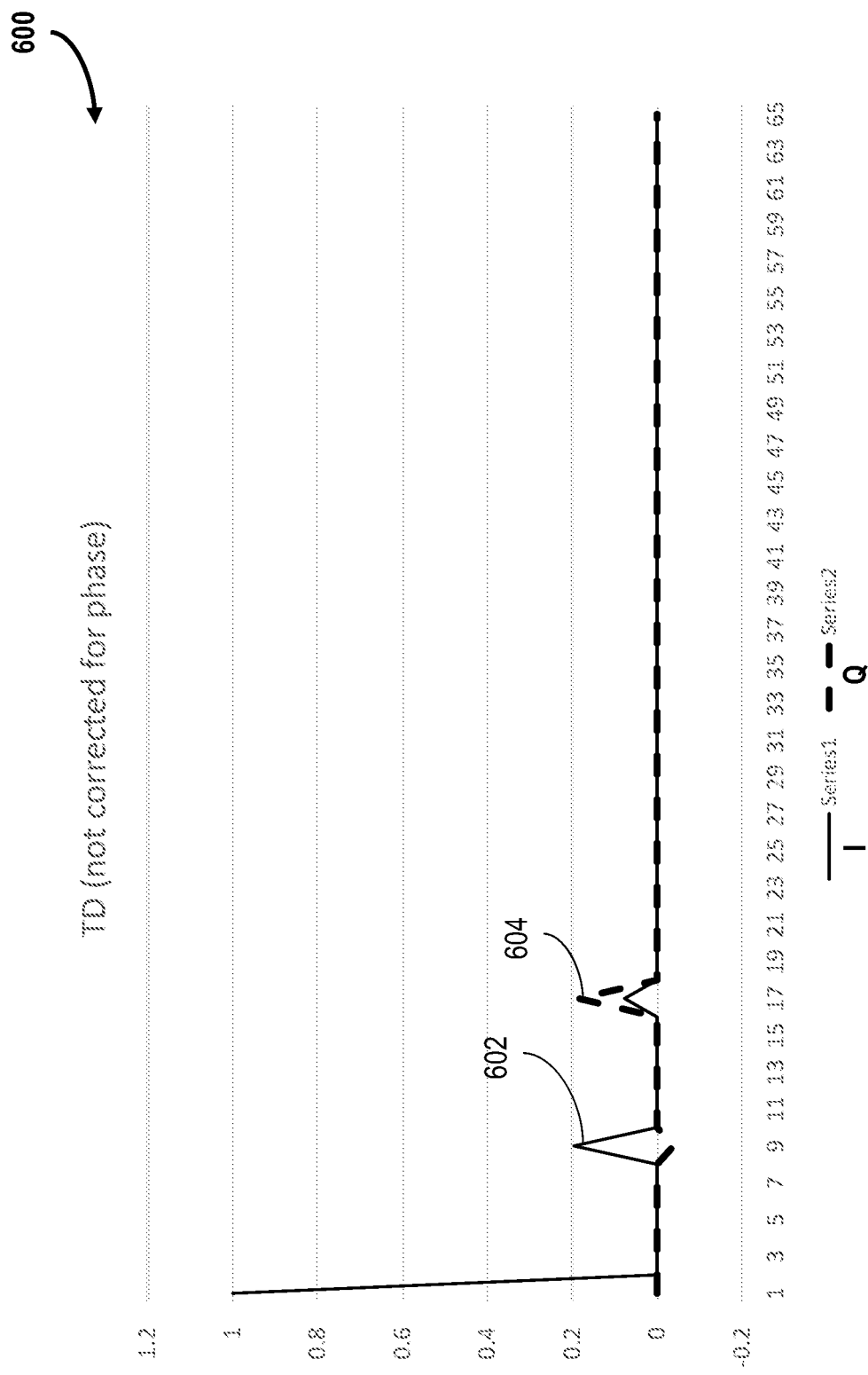
FIG. 6 is a graphical illustration depicting a comparative time domain plot of the comparative frequency plot depicted in FIG. 5.

FIG. 6 is a graphical illustration depicting a comparative time domain plot 600 of comparative frequency plot 500, FIG. 5. More particularly, comparative time domain plot 600 includes a first subplot 602 (solid line) and a second subplot 604 (dashed line) corresponding to first subplot 502 and second subplot 504, FIG. 5, respectively, but after performance of an IFFT operation on the respective spectral data thereof. That is, subplots 602, 604 represent the time domain counterparts of the frequency domain samples of subplots 502, 504, respectively. In a conventional transmission system, the IFFT processor is typically disposed with the test instrument (e.g., probe, network analyzer, etc.); however, according to the present embodiments, such operations may be distributed (e.g., spectral measurement by a probe or analyzer, IFFT and other DSP by a Cloud or web service, and the correction by the modem). In the exemplary embodiment, sampling operations are performed at the testing point.

For the real-world results depicted in FIG. 6, the time domain samples show t=8 at 0 degrees, and t=16 at 90 degrees, as indicated by the respective peaks of subplots 602, 604. As can also be seen from time domain plot 600, the amplitudes of both subplots are correct, but due to the frequency shift, the respective phase data on the delayed time domain samples are not. That is, in the case where there is no frequency shift (e.g., beginning at 9 Hz), the phase data is correct, and thus the phase angles would not need correction.

Nevertheless, real-world transmission systems do not all start at 0. Accordingly, an additional phase correction step is illustrated further below with respect to FIG. 7.

Figure 7:
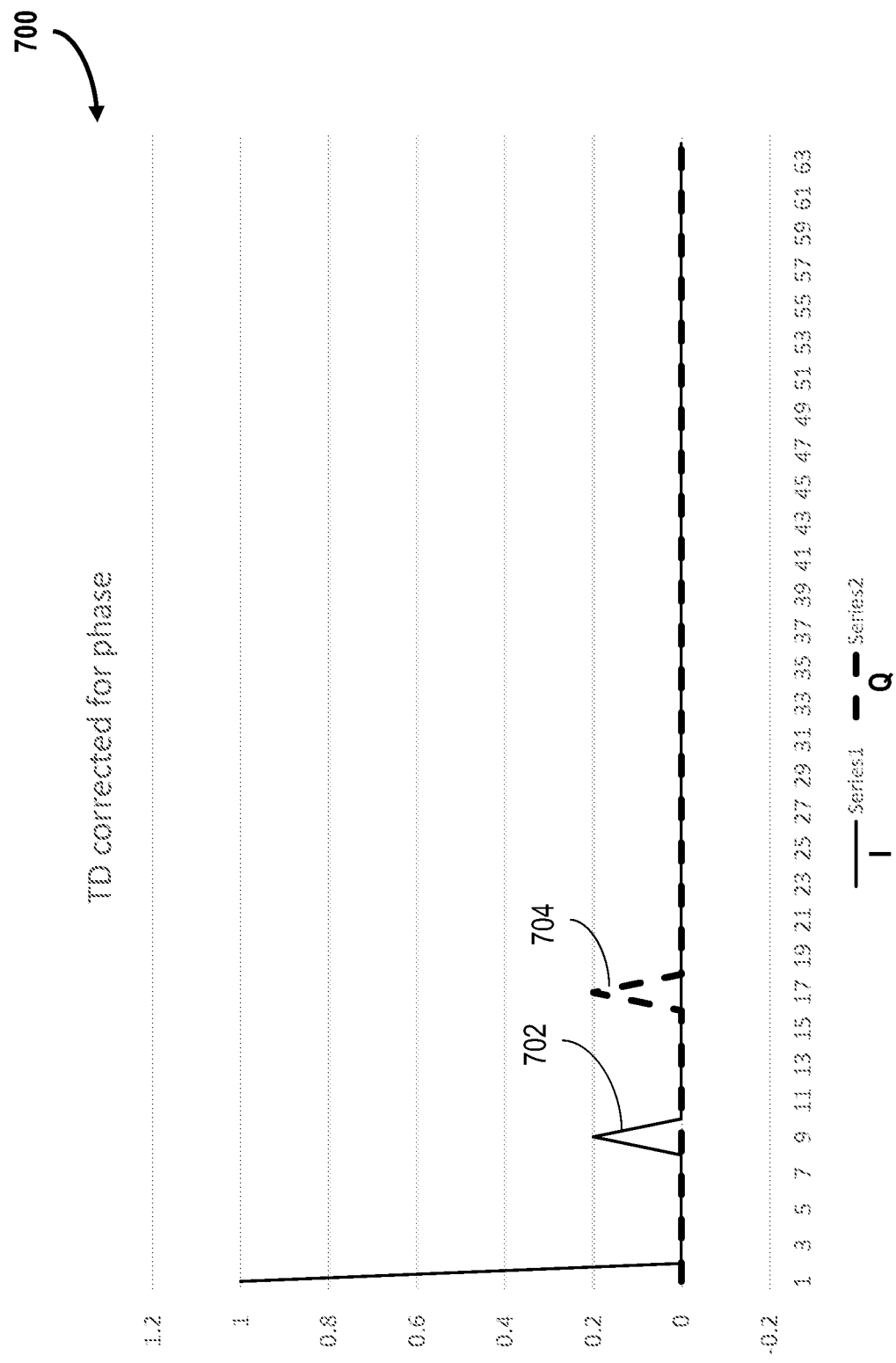
FIG. 7 is a is a graphical illustration depicting a phase correction plot of the comparative time domain plot depicted in FIG. 6.

FIG. 7 is a graphical illustration depicting a phase correction plot 700 of comparative time domain plot 600, FIG. 6. More particularly, phase correction plot 700 includes a first subplot 702 (solid line) and a second subplot 704 (dashed line) corresponding to first subplot 602 and second subplot 604, respectively, of comparative time domain plot 600, FIG. 6, but after performance of a phase correction operation on the respective time domain data samples thereof. That is, subplots 702, 704 represent the respective time domain data of subplots 602, 604, respectively, after a phase rotation correction. As can be seen from the corrected time data illustrated in FIG. 7, the phase correction advantageously follows a linear relationship with both the frequency offset and time index.

According to the embodiments described above, in the case of damage to a transmission line, the phase correction to "de-spin" the resulting reflection coefficient(s) may be determined, other than the physical capture of spectral data from the transmission system by entirely mathematical algorithms programmed into one or more of the respective component processors typically found in existing digital transmission systems. Such new and additional algorithmic capabilities, however, are hardly abstract; some spectral measurement is required, and the terminal device or modem is configured to receive instructions to utilize the calculated "spin coefficient" to de-spin the rotating reflection coefficient at the modem. Accordingly, whether the analysis of the spectral data and calculation of the spin coefficient are centralized to a single system component, or distributed among several components of the transmission system, the present systems and methods avoid the need for an on-site technician drop-cable test in many cases.

Figure 8:
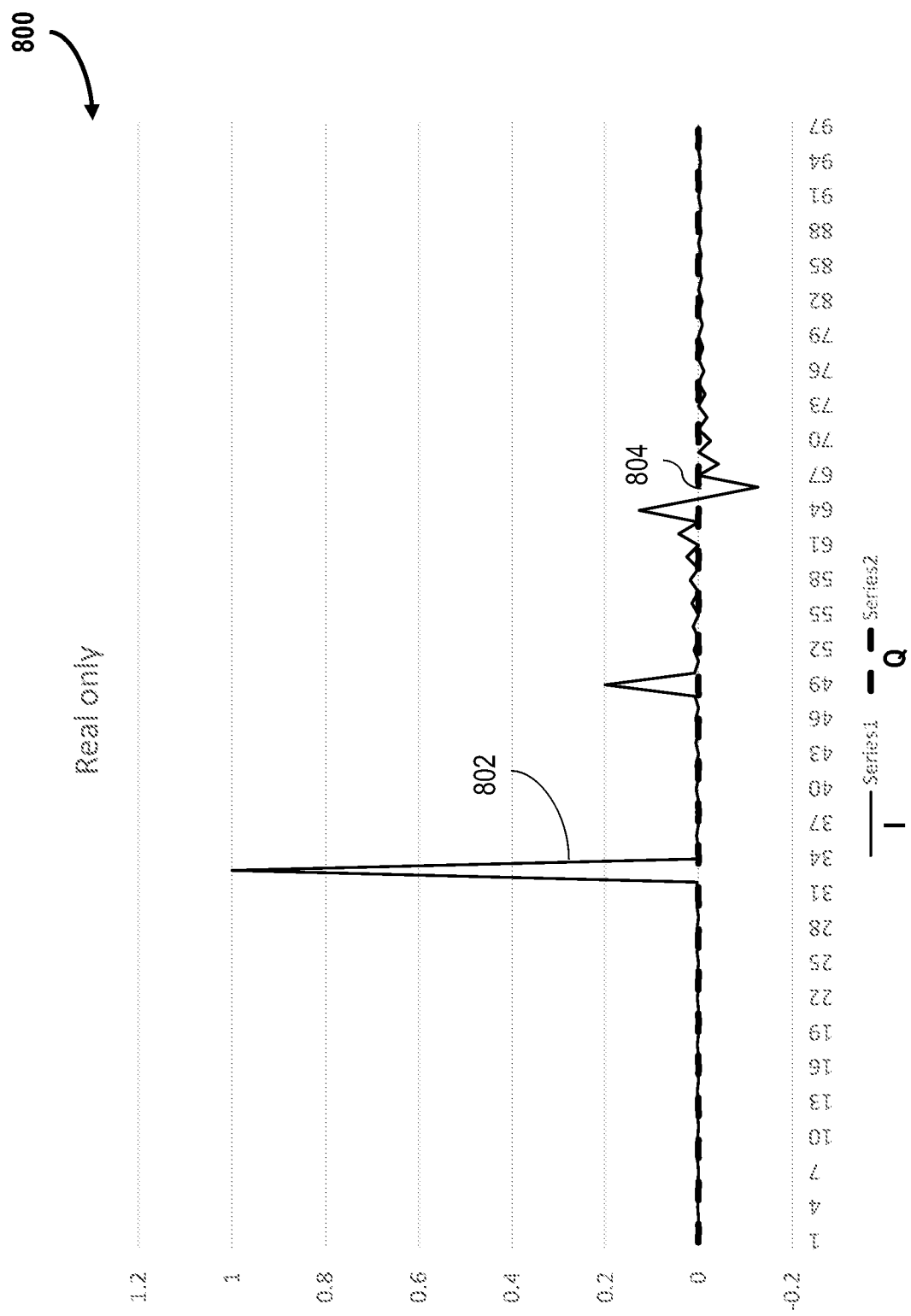
FIG. 8 is a graphical illustration depicting a conversion plot of the phase correction plot depicted in FIG. 7.

FIG. 8 is a graphical illustration depicting a conversion plot 800 of phase correction plot 700, FIG. 7. More particularly, in an optional subprocessing step, the complex (i.e., real and imaginary) data from phase correction plot 700 is further converted into first subplot 802 and second subplot 804 of real-only coefficients. That is, real first sub-plot 802 is effectively doubled, and imaginary second subplot is effectively reduced to zero. In an exemplary embodiment, the real-only conversion is accomplished by first creating a complex conjugate mirror in the frequency domain, and then performing an IFFT operation on the complex conjugate mirror. Using this optional processing technique, twice the number of frequency points and time samples may be obtained, thus greatly improving the resolution and accuracy of the calculated spin coefficient and phase correction at the modem. As may be noted from second subplot 804, at t=16, the imaginary response resembles a Hilbert transform. This additional computational processing step thus provides still further significant advantages over conventional reflection evaluation techniques.

The present systems and methods are therefore particularly useful in the case where the delay in a reflection or echo is relatively short. In such cases, the corresponding separation between ripple peaks in the frequency domain will be large. However, due to windowing effects, the presence of a significant DC term in the time series (i.e., the x[0] complex term) of the corresponding time sequence may render an reflection having a smaller, more slightly delayed, echo more difficult to resolve. Accordingly, the corresponding convolution is a sin(x)/x series, as opposed to a Kronecker delta function. It may be desirable, in such scenarios, to remove the DC term to simplify the correction calculations, particularly in the case where a window function is desired to reduce ringing. Removal of the DC term may also be additionally advantageous in the case where the DC term is spread, such as may result from group delay or tilt.

Although the present techniques provide significant advantages to many different types of transmission systems, the systems and methods described herein are particularly applicable to cable transmission networks. For example, cable network technicians are known to commonly utilize TDR techniques to obtain a magnitude-only, DC-referenced, real-valued impulse response derived from a frequency domain network analyzer test or FBC. According to the present techniques though, these existing conventional measurement techniques may be readily adapted, as described herein, to further determine whether the obtained impulse responses indicate an open, a short, an inductive impairment, a capacitive impairment, or any complex vector.

The present systems and methods are of further advantageous applicability to a wide variety of complex data set where frequency(ies) of test points is known. The versatility of the present embodiments, for example, enable use with not only upstream predistortion OFDMA data, but also with complex data sets such as those implemented as ATDMA predistortion coefficients. Furthermore, the innovative techniques described herein are also applicable even in the case where a real-only frequency domain sequence is available (e.g., a Real-Only Network Analyzer or TDR). In such cases, a complex sequence may be produced from the real-only sequence, and the techniques described above implemented with respect to the resulting complex sequence. Thus, the wider the bandwidth, the better the resolution on lower-delay echoes, as well as multiple echoes that are close to one another in frequency.

The systems and methods described herein are therefore of particular usefulness with respect to the many millions of DOCSIS 3.1 modems and cable modems presently deployed throughout the world. According to the present embodiments, many of these millions of deployed modems, in the event of damage to a connected coaxial cable, may be advantageously configured to self-calibrate without the need for a technician drop-cable on-site measurement. The present embodiments though, are also particularly advantageous with respect to OFDM signals that are not necessarily transmitted according to DOCSIS 3.1. The embodiments herein thus represent significant improvements to one or more of the transmission system, the network analyzer, and the terminal device/modem.

Although specific features of various embodiments may be shown in some drawings and not in others, such is for convenience only. In accordance with the principles of the systems and methods described herein, any feature of a drawing may be referenced or claimed in combination with any feature of any other drawing.

Some embodiments involve the use of one or more electronic or computing devices. Such devices typically include a processor, processing device, or controller, such as a general purpose central processing unit (CPU), a graphics processing unit (GPU), a microcontroller, a reduced instruction set computer (RISC) processor, an application specific integrated circuit (ASIC), a programmable logic circuit (PLC), a programmable logic unit (PLU), a field programmable gate array (FPGA), a digital signal processing (DSP) device, and/or any other circuit or processing device capable of executing the functions described herein. The methods described herein may be encoded as executable instructions embodied in a computer readable medium, including, without limitation, a storage device and/or a memory device. Such instructions, when executed by a processing device, cause the processing device to perform at least a portion of the methods described herein. The above examples are exemplary only, and thus are not intended to limit in any way the definition and/or meaning of the term processor and processing device.

This written description uses examples to disclose the embodiments, including the best mode, and also to enable any person skilled in the art to practice the embodiments, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

Computer Program Listing

```
//RealOnlyfromFD C++ code
#include <iostream>
#include <math.h>
#include <stdio.h>
#include <stdlib.h>
#include <malloc.h>
#include <stdlib.h>
#include <string.h>
typedef struct {float real, imag;} COMPLEX;
extern void fourier(COMPLEX *,int);//fast Fourier transform
extern void ifourier(COMPLEX *,int);//fast inverse Fourier transform
extern void black(COMPLEX *,int);
extern void makeSignal( );
float vr[1024],vi[1024], PI=3.14156,dB;
int main( ) {
    makeSignal( );
    int i,j,k=32;
    char zz;
    float ang, ang2[512], mag, scale, cang[512],
cr1[1024],ci1[1024],cr2[1024],ci2[1024],cr3[1024],ci3[1024],cr4[1024],ci4[1024];
    FILE *inputdata, *outputdata;
    COMPLEX *y;
    y=(COMPLEX*) calloc(1024, sizeof(COMPLEX));
    if(!y){printf("\n Unable to allocate input memory.\n");printf("\x7");exit(1);};
    COMPLEX *x;
    x=(COMPLEX*) calloc(1024, sizeof(COMPLEX));
    if(!x){printf("\n Unable to allocate input memory.\n");printf("\x7");exit(1);};
    COMPLEX *xx;
    xx=(COMPLEX*) calloc(1024, sizeof(COMPLEX));
    if(!xx){printf("\n Unable to allocate input memory.\n");printf("\x7");exit(1);};
    if( (inputdata = fopen("input1.txt", "r") ) == NULL){
        printf("could not open file.\n");
        system("pause");
        exit(0);
    }
    if( (outputdata = fopen("output1.txt", "w") ) == NULL){
        printf("could not open file.\n");
        system("pause");
        exit(0);
    }
    for(i=0;i<1024;i++){
    fscanf(inputdata,"%f%f%f%f%f%f%f%f",&cri[i],&ci1[i],&cr2[i],&ci2[i],
&cr3[i],&ci3[i],&cr4[i],&ci4[i]);
]);
//      if(i<10)printf("%d\t%f\t%f\n",i,cr1[i],ci1[i]);
    }
    int offset =120;
//    int startNr =115+offset; //7.75/.05 MHz
    int startNr = 0+offset; //for makeSignal data, which starts at 0 MHz
    fprintf(outputdata,"Offset = %d\n",offset);
    for(i=0;i<512;i++){
//      y[i].real = cr3[i+offset];//10.75 Mhz to 36.35 MHz
//      y[i].imag = ci3[i+offset];
        y[i].real = vr[i+offset ];
        y[i].imag = vi[i+offset];
    //printf("y %d\t%f\t%f\n",i,y[i].real,y[i].imag);
    }
    //black(y,512);//window data
    ang = - atan2(y[0].imag,y[0].real);
    printf("ang=%f radians\n",ang);
ang = 0;
    //https://en.wikipedia.org/wiki/Rotation_matrix
    for(i=0;i<512;i++){//rotate to get xx[0] to be 0
        //xx[i].real = y[i].real * cos(ang) - y[i].imag *sin(ang);
        //xx[i].imag = y[i].real * sin(ang) + y[i].imag* cos(ang);
        xx[i].real = y[i].real;
        xx[i].imag = y[i].imag;
    }
    for(1=0;i<512;i++){
    mag = sqrt(xx[i].real*xx[i].real + xx[i].imag*xx[i].imag);
    ang = atan2(xx[i].imag,xx[i].real);
    fprintf(outputdata,"f %d\t%f\t%f\t%f\t%f\n",i,xx[i].real,xx[i].imag,mag,ang);
    }
    ifourier(xx,9);
```

-continued

Computer Program Listing

```
    for(i=0;i<512;i++){
    mag = sqrt(xx[i].real*xx[i].real + xx[i].imag*xx[i].imag);
    ang = atan2(xx[i].imag,xx[i].real);
    fprintf(outputdata,"t %d\t%f\t%f\t%f\t%f\n",i,xx[i].real,xx[i].imag,mag,ang);
    }
    //now correct for angle in TD due to freq mixing
    for(i=0;i<512;i++){
        ang2[i] = ((float)startNr*(float)i*2*Pl)/512;
    //    printf("%d\t%f\n",i,ang2[i]);
    }
}
// now correct phase
for(i=0;i<512;i++){
    x[i].real = xx[i].real * cos(ang2[i]) - xx[i].imag *sin(ang2[i]);
    x[i].imag = xx[i].real * sin(ang2[i]) + xx[i].imag* cos(ang2[i]);
    mag = sqrt(x[i].real*x[i].real + x[i].imag*x[i].imag);
    ang = atan2(x[i].imag,x[i].real);
//    printf("~%d\t%f\t%f\t%f\t%f\n",i,x[i].real,x[i].imag,mag,ang);
    fprintf(outputdata,"~%d\t%f\t%f\t%f\t%f\n",i,x[i].real,x[i].imag,mag,ang);
}
fourier(x,9);//back into fd to make a mirror
    for(i=1;i<512;i++){
        x[1024-i].real =x[i].real;
        x[1024-i].imag = -x[i].imag;
    }
    x[512].real = x[0].real;
    x[512].imag = x[0].imag;//should be zero
    for(i=0;i<1024;i++){
    fprintf(outputdata,"!f %d\t%f\t%f\n",i,x[i].real,x[i].imag);
    }
ifourier(x,10);
    for(i=1024-32;i<1024;i++){
    fprintf(outputdata,"t %d\t%f\t%f\n",i,x[i].real,x[i].imag);
    }
    for(i=0;i<1024;i++){
    fprintf(outputdata,"t %d\t%f\t%f\n",i,x[i].real,x[i].imag);
    }
    printf("Hello");
    fclose(inputdata);
    fclose(outputdata);
}//end of main
void makeSignal( ){
    int i;
    float a=.2, b=.2, n=16;
    FILE *signal;
        if( (signal = fopen("signal.txt", "w") ) == NULL){
        printf("could not open file.\n");
        system("pause");
        exit(0);
    }
    float th = -Pl/2;
    //float th = Pl;
    for(i=0;i<1024;i++){
        //vr[i] = 1 + a*cos(1*Pl*n*(float)i/512) + b*cos(2*Pl*n*(float)i/512);
        //vi[i] = - a*sin(1*Pl*n*(float)i/512) - b*sin(2*Pl*n*(float)i/512);
        vr[i] = 1 + a*cos(1*Pl*n*(float)i/512) + b*cos(th+(2*Pl*n*(float)i/512));
        vi[i] = - a*sin(1*Pl*n*(float)i/512) - b*sin(th+(2*Pl*n*(float)i/512) );
//    vi[i] = -vi[i];
        fprintf(signal,"%d\t%f\t%f\t%f\n",i,vr[i],vi[i],atan2(vi[i],yr[i]-1));
        }
        printf("done making signal\n");
}
//----------------------------------------------------------------------------------------------------
void fourier(COMPLEX *x,int m)//takes a fourier transform of size 2 to the m power
{
    static COMPLEX *w;
    static int mstore = 0;
    static int n = 1;
    COMPLEX u,temp,tm;
    COMPLEX *xi,*xip,*xj,*wptr;
    int i,j,k,l,le,windex;
    double arg,w_real,w_imag,wrecur_real,wrecur_imag,wtemp_real;
    if(m != mstore) {
    if(mstore != 0) free(w);
    mstore = m;
    if(m == 0) exit(1);
    n =1 << m;
    le =n/2;
```

Computer Program Listing

```
w = (COMPLEX *) calloc(le-1,sizeof(COMPLEX));
if(!w) {
printf("\nUnable to allocate array\n");
exit(1);
}
arg = 4.0*atan(1.0)/le;
wrecur_real = w_real = cos(arg);
wrecur_imag = w_imag = -sin(arg);
xj = w;
for (j = 1; j < le ; j++) {
   xj->real = (float)wrecur_real;
   xj->imag = (float)wrecur_imag;
   xj++;
   wtemp_real = wrecur_real*w_real - wrecur_imag*w_imag;
   wrecur_imag = wrecur_real*w_imag + wrecur_imag*w_real;
   wrecur_real = wtemp_real;
}
}
le = n;
windex = 1;
for (l = 0 ; l < m ; l++) {
le = le/2;
for(i = 0; i < n; i = i + 2*le){
xi =x + i;
xip =xi + le;
temp.real = xi->real + xip->real;
tenip.imag = xi->imag + xip->imag;
xip->real = xi->real - xip->real;
xip->imag = xi->imag - xip->imag;
*xi = temp;
}
wptr = w + windex - 1;
for (j = 1; j < le ; j++) {
u = *wptr;
for(i = j; i < n ; i = i + 2*le){
xi = x + i;
xip = xi + le;
temp.real = xi->real + xip->real;
tenip.imag = xi->imag + xip->imag;
tm.real = xi->real - xip->real;
tm.imag =xi->imag - xip->imag;
xip->real = tm.real*u.real - tm.imag*u.imag;
xip->imag = tm.real*u.imag + tm.imag*u.real;
*xi = temp;
}
wptr = wptr + windex;
}
windex = 2*windex;
}
j = 0;
for (i = 1; i < (n-1); i++) {
k = n/2;
while(k <= j) {
j = j - k;
k = k/2;
}
j = j + k;
if (i < i) {
xi = x + i;
xj = x + j;
temp = *xj;
*xj =*xi;
*xi = temp;
}
}
}//end of fourier
void ifourier(COMPLEX *x,int m)
{
    static COMPLEX *w;      /* used to store the w complex array */
    static int mstore = 0;  /* stores m for future reference */
    static int n = 1;       /* length of ifft stored for future */
    COMPLEX u,temp,tm;
    COMPLEX *xi,*xip,*xj,*wptr;
    int i,j,k,l,le,windex;
    double arg,w_real,w_imag,wrecur_real,wrecur_imag,wtemp_real;
    float scale;
    if(m != mstore) {
```

Computer Program Listing

```
/* free previously allocated storage and set new m */
    if(mstore !=0) free(w);
    mstore = m;
    if(m == 0) exit(1);        /* if m=0 then done */
/* n = 2**m = inverse fft length */
    n =1 << m;
    le = n/2;
/* allocate the storage for w */
    w = (COMPLEX *) calloc(le-1,sizeof(COMPLEX));
    if(!w) {
        printf("\nUnable to allocate complex W array\n");
        exit(1);
    }
/* calculate the w values recursively */
    arg = 4.0*atan(1.0)/le;    /* PI/le calculation */
    wrecur_real = w_real = cos(arg);
    wrecur_imag = w_imag = sin(arg); /* opposite sign from fft */
    xj = w;
    for (j = 1 ; j < le ; j++){
        xj->real = (float)wrecur_real;
        xj->imag = (float)wrecur_imag;
        xj++;
        wtemp_real = wrecur_real*w_real - wrecur_imag*w_imag;
        wrecur_imag = wrecur_real*w_imag + wrecur_imag*w_real;
        wrecur_real = wtemp_real;
    }
}
/* start inverse fft */
    le =n;
    windex =1;
    for (l =0; l < m ; l++){
        le = le/2;
/* first iteration with no multiplies */
        for(i = 0; i < n ; i = i + 2*le){
            xi = x +i ;
            xip = xi + le;
            temp.real = xi->real + xip->real;
            temp.imag = xi->imag + xip->imag;
            xip->real = xi->real - xip->real;
            xip->imag = xi->imag - xip->imag;
            *xi = temp;
        }
/* remaining iterations use stored w */
        wptr =w + windex - 1;
        for (j = 1; j < le; j++) {
            u = *wptr;
            for( i = j ; i < n ; i = i + 2*le){
                xi = x + i;
                xip = xi + le;
                temp.real = xi->real + xip->real;
                temp.imag = xi->imag + xip->imag;
                tm.real = xi->real - xip->real;
                tm.imag = xi->imag - xip->imag;
                xip->real = tm.real*u.real - tm.imag*u.imag;
                xip->imag = tm.real*u.imag + tm.imag*u.real;
                *xi =temp;
            }
            wptr = wptr + windex;
        }
        windex = 2*windex;
    }
/* rearrange data by bit reversing */
    j = 0;
    for (i =1; i <(n-1); i++) {
        k = n/2;
        while(k <= j) {
            j = j - k;
            k = k/2;
        }
        j = j + k;
        if (i < i) {
            xi = x + i;
            xj = x + j;
            temp = *xj;
            *xj = *xi;
            *xi = temp;
        }
```

-continued

Computer Program Listing

```
    }
/* scale all results by 1/n */
    scale = (float)(1.0/n);
    for(i = 0; i < n ; i++) {
       x->real = scale*x->real;
       x->imag = scale*x->imag;
       x++;
    }
}
void black( COMPLEX *x, int n)
{
  int i;
  double black,factor;
  factor = 8.0*atan(1.0)/(n-1);
  for (i=0; i<n; ++i){
    black = 0.42 - 0.5*cos(factor*i) + 0.08*cos(2*factor*i);
    x->real *= black;
    x->imag *= black;
    x++;
  }
}
```

The invention claimed is:

1. A method of calibrating a terminal device connected to a transmission line containing at least one impairment, comprising the steps of:
   obtaining a sequence of frequency domain samples for a digital signal transmitted to the terminal device over the transmission line;
   determining, from the obtained sequence of frequency domain samples, a reflection coefficient from a frequency domain reflection signal of the digital signal arising from the at least one impairment;
   converting the sequence of frequency domain samples and the frequency domain reflection signal into a time domain to generate a complex time domain sample sequence having a real I time component and an imaginary Q time component;
   correcting the complex time domain sample sequence into a corrected time sequence having a phase value of the imaginary Q time component corresponding to a phase value of the real I time component;
   calculating a correcting spin coefficient from the corrected time sequence; and
   calibrating the terminal device with the correcting spin coefficient to mitigate a rotation of the reflection coefficient.

2. The method of claim 1, wherein the step of obtaining comprises a full band capture (FBC) of a frequency spectrum of the digital signal and the frequency domain reflection signal by a testing instrument connected to the transmission line.

3. The method of claim 2, wherein the testing instrument is a network analyzer disposed upstream of the terminal device.

4. The method of claim 3, wherein the network analyzer is disposed proximate at least one of a hub, a central office, and a fiber node of a transmission network connected to the transmission line.

5. The method of claim 4, wherein at least one of the steps of determining, converting, correcting, and calculating are executed by a node processor of the fiber node.

6. The method of claim 5, wherein the step of calibrating includes an instruction, from the node processor to the terminal device, for the terminal device to execute a calibration operation according to the calculated correcting spin coefficient.

7. The method of claim 3, wherein at least one of the steps of determining, converting, correcting, and calculating are executed by the network analyzer.

8. The method of claim 7, wherein the step of calibrating includes an instruction, from the network analyzer to the terminal device, for the terminal device to execute a calibration operation according to the calculated correcting spin coefficient.

9. The method of claim 2, wherein the testing instrument is a high impedance probe in cooperation with a data acquisition device disposed upstream of the terminal device.

10. The method of claim 9, wherein the data acquisition device includes a sampler, and wherein at least one of the steps of determining, converting, and correcting are executed by the sampler.

11. The method of claim 2, wherein the testing instrument is the terminal device.

12. The method of claim 11, wherein at least one of the steps of determining, converting, correcting, and calculating are executed by third party computational service in operable communication with the terminal device.

13. The method of claim 11, wherein the terminal device is configured to self-calibrate according to the calculated correcting spin coefficient.

14. The method of claim 1, wherein the terminal device is at least one of a modem, a cable modem (CM), an optical network unit (ONU), a digital subscriber line (DSL) unit, and a satellite modem.

15. A network analyzer coupled with a transmission line of a digital communication network, the network analyzer comprising:
   a processor in operable communication with the transmission line; and
   a memory device for storing computer-executable instructions, which, when executed by the processor, cause the processor to:
      obtain a sequence of frequency domain samples for a digital signal transmitted over the transmission line to a downstream terminal device;
      determine, from the obtained sequence of frequency domain samples, a reflection coefficient of a frequency domain reflection signal arising from a physical impairment of the transmission line disposed between the network analyzer and the downstream terminal device;

convert the sequence of frequency domain samples and the frequency domain reflection signal into a time domain to generate a complex time domain sample sequence having a real I component and an imaginary Q component in the time domain;

correct the complex time domain sample sequence into a corrected time sequence having a phase value of the imaginary Q time component corresponding to a phase value of the real I time component;

calculate a correcting spin coefficient from the corrected time sequence; and instruct the downstream terminal device calibrate a rotation of the reflection coefficient arising from the physical impairment using the calculated correcting spin coefficient.

16. The network analyzer of claim 15, disposed within a fiber node of the digital communication network contacting the transmission line.

17. The network analyzer of claim 15, wherein the instructions further cause the processor to detect, based on the calculated correcting spin coefficient, that the physical impairment includes at least one of an open circuit, a short circuit, an inductive impairment, and a capacitive impairment.

18. The network analyzer of claim 15, further comprising a sampling unit, and wherein the instructions further cause the processor to obtain the sequence of frequency domain samples for the digital signal directly from the sampling unit.

19. The network analyzer of claim 18, further comprising a measurement device in direct contact with the transmission line, and wherein the instructions further cause the processor to direct the sampling unit to sample a frequency spectrum of the digital signal directly measured by the measurement device.

20. The network analyzer of claim 19, wherein the measurement device is disposed remotely from the processor.

\* \* \* \* \*